United States Patent
Meske et al.

(10) Patent No.: US 9,030,197 B1
(45) Date of Patent: May 12, 2015

(54) ACTIVE COMPENSATION FOR AMBIENT, EXTERNAL MAGNETIC FIELDS PENETRATING CLOSED LOOP MAGNETIC CORES PARTICULARLY FOR A FLUXGATE CURRENT SENSOR

(71) Applicant: Ohio Semitronics, Inc., Hilliard, OH (US)

(72) Inventors: Richard A. Meske, Hilliard, OH (US); Andrew L. Warnock, Hilliard, OH (US)

(73) Assignee: Ohio Semitronics Inc., Hilliard, OH (US)

( * ) Notice: Subject to any disclaimer, the term of this patent is extended or adjusted under 35 U.S.C. 154(b) by 293 days.

(21) Appl. No.: 13/804,097

(22) Filed: Mar. 14, 2013

Related U.S. Application Data

(60) Provisional application No. 61/614,697, filed on Mar. 23, 2012.

(51) Int. Cl.
    G01R 33/04    (2006.01)
    G01R 33/00    (2006.01)
    G01R 19/00    (2006.01)
    G01R 33/025   (2006.01)
    G01R 15/18    (2006.01)

(52) U.S. Cl.
    CPC ........ G01R 33/0017 (2013.01); G01R 19/0092 (2013.01); G01R 33/04 (2013.01); G01R 33/025 (2013.01); G01R 15/185 (2013.01)

(58) Field of Classification Search
    CPC .. G01R 33/04; G01R 33/025; G01R 33/0017; G01R 15/185; G01R 19/0092
    USPC ........................................ 324/225
    See application file for complete search history.

(56) References Cited

U.S. PATENT DOCUMENTS

| 3,277,416 | A | 10/1966 | Barr |
| 3,816,776 | A | 6/1974 | Chari |
| 3,895,869 | A | 7/1975 | Lewis |
| 5,130,655 | A | 7/1992 | Conti |
| 5,465,012 | A | 11/1995 | Dunnam |
| 5,633,587 | A | 5/1997 | Hirumachi |
| 6,316,931 | B1 * | 11/2001 | Nakagawa et al. ....... 324/117 R |
| 6,731,968 | B2 | 5/2004 | Buchanan |

(Continued)

FOREIGN PATENT DOCUMENTS

CN    101308197 B    9/2010

*Primary Examiner* — Bot LeDynh
*Assistant Examiner* — Adam Clarke
(74) *Attorney, Agent, or Firm* — Frank H. Foster; Kremblas & Foster

(57) ABSTRACT

An apparatus, that is particularly advantageous for compensating for the earth's magnetic field at a fluxgate current sensor. The apparatus and method actively compensate for local anomalies and loop mismatch at local segments distributed around closed loops of ferromagnetic material in order to null out sources of error that arise in the presence of an external magnetic field. External flux nulling circuits null the external magnetic flux at each of a plurality of associated pairs of diagonally opposite segments of coaxial closed loop cores. Each flux nulling circuit has a pair of diagonally opposite segment sensing coils and a pair of diagonally opposite segment cancellation coils. A flux detecting circuit detects the net magnetic flux in associated, diagonally opposite segments. A negative feedback control circuit drives the segment cancellation coils with a current to drive the flux detected by the segment detecting circuit to a minimum.

13 Claims, 6 Drawing Sheets

(56) References Cited

U.S. PATENT DOCUMENTS 7,272,520 B2 * 9/2007 Sweeting .................. 702/64
7,525,314 B1   4/2009 Heiland 2010/0164673 A1   7/2010 Shim
2012/0062215 A1 * 3/2012 Ide et al. .................. 324/202
2015/0042325 A1 * 2/2015 Snoeij et al. .............. 324/251

* cited by examiner

FLUXGATE CURRENT SENSOR THEORY

Fig. 5
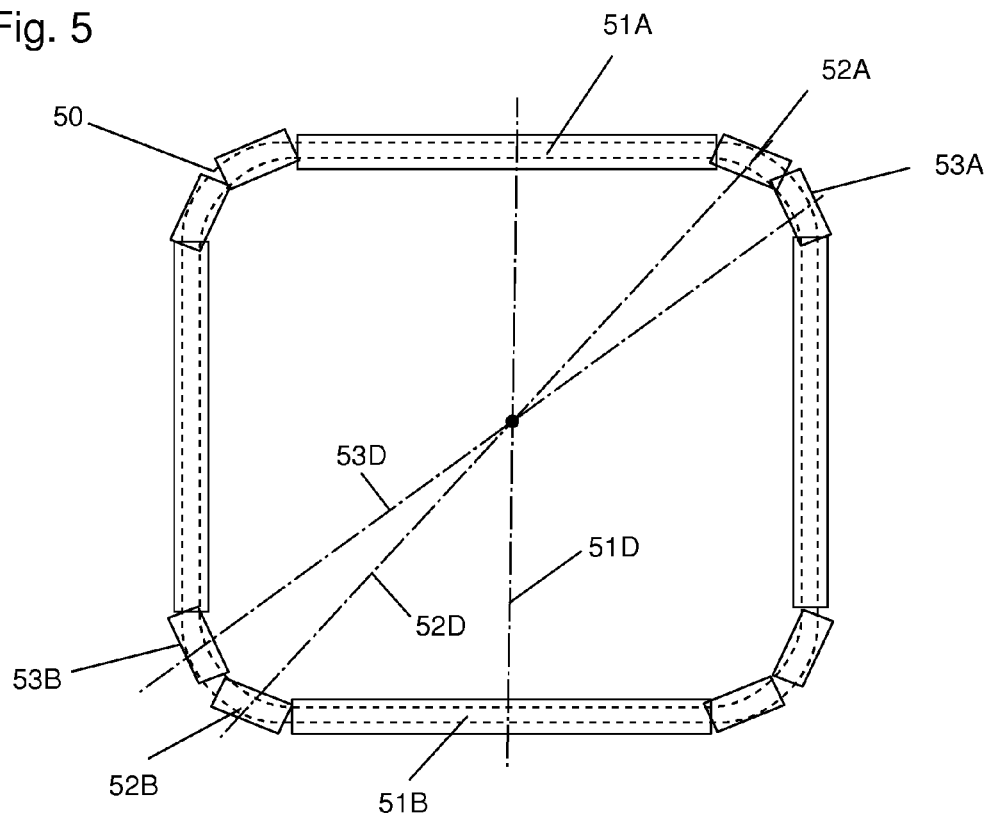
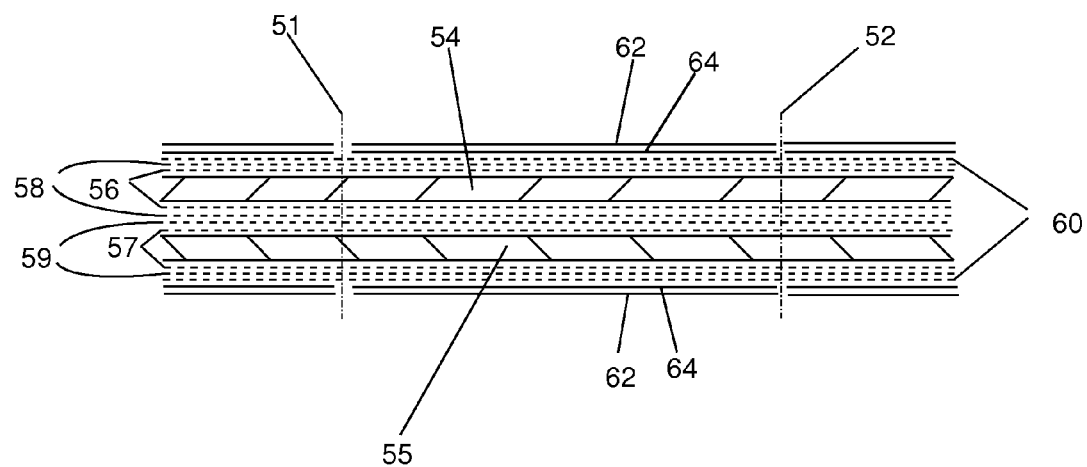
Fig. 6

Fig. 7
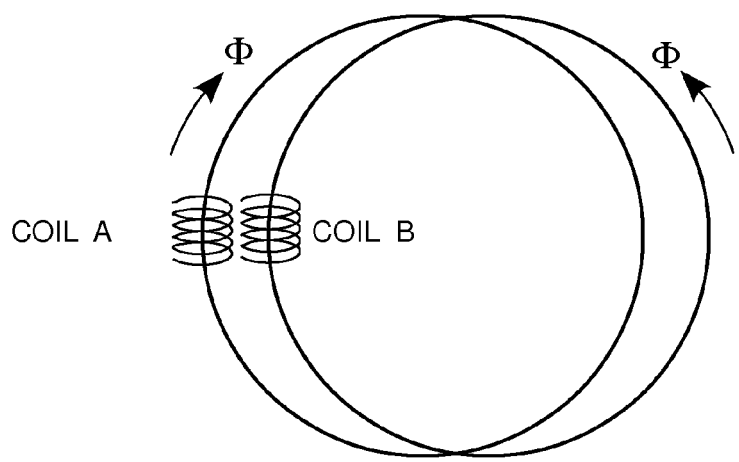
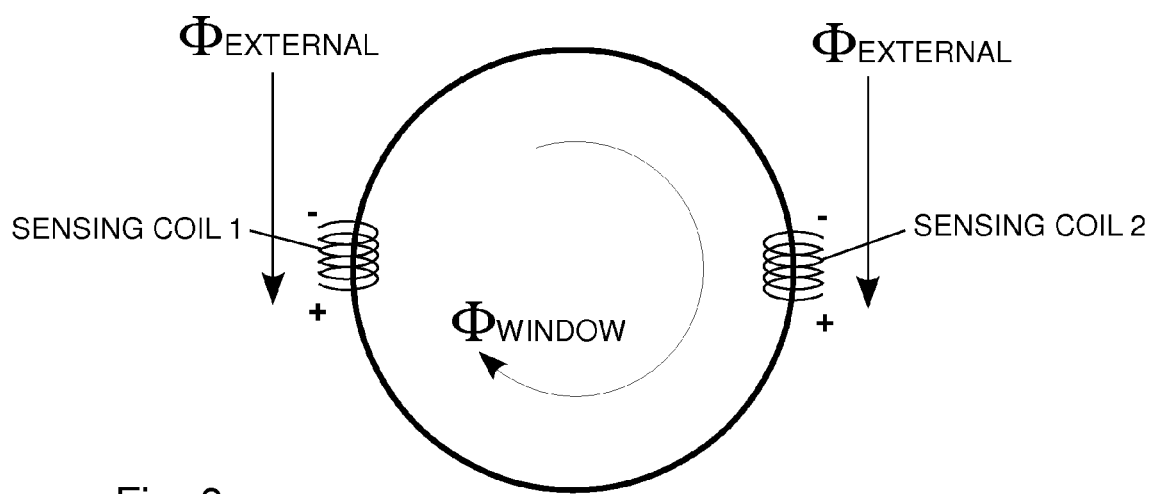
Fig. 8

ACTIVE COMPENSATION FOR AMBIENT, EXTERNAL MAGNETIC FIELDS PENETRATING CLOSED LOOP MAGNETIC CORES PARTICULARLY FOR A FLUXGATE CURRENT SENSOR

CROSS-REFERENCES TO RELATED APPLICATIONS

This application claims the benefit of U.S. Provisional Application No. 61/614,697 filed 23 Mar. 2012. The above prior application is hereby incorporated by reference.

STATEMENT REGARDING FEDERALLY-SPONSORED RESEARCH AND DEVELOPMENT (Not Applicable)

REFERENCE TO AN APPENDIX

An appendix is filed herewith and is hereby incorporated herein by reference. The appendix is entitled *Control System for Active Magnetic Shielding for Fluxgate Cores*.

BACKGROUND OF THE INVENTION

This invention is an improved form of active magnetic shielding and relates generally to electrical devices that utilize closed loop cores of a magnetic material and are affected in an undesirable manner by an external magnetic field, such as the earth's magnetic field. The invention is an apparatus and method for actively canceling components of the flux of an external magnetic field that affects the operation of such electrical devices, including electrical current measuring apparatus and current transformers. The invention is particularly an improvement in fluxgate current sensing apparatus because it not only increases their accuracy in the presence of external magnetic fields but also aids measurement of electrical currents that produce a magnetic field in the cores that is substantially less than the external magnetic field.

An external magnetic field is a magnetic field that is ambient in the environment of an electrical device. The external magnetic field that is usually of principal concern is the earth's magnetic field. For most purposes, the earth's magnetic field is considered to be a static field even though it varies in magnitude and orientation as a function of time and position on the earth. Furthermore, the effect of the external magnetic field also varies as a function of the orientation of the device with respect to the magnetic poles of the earth, nearby magnetic anomalies and ferromagnetic materials. The purpose of the invention is to actively cancel the external magnetic field, or at least the component of the external magnetic field that is adversely affecting the operation of an electrical device that utilizes closed loop cores. Embodiments of the invention actively respond to changes in the magnitude and relative direction of the external magnetic field through the closed loop cores in order to maintain the cancellation of the component of the external magnetic field that affects the operation of the device.

Various implementations of fluxgate current sensing apparatus are well known in the prior art. Fluxgate current sensing circuitry senses the current via the current's magnetic field through two closed loop ferromagnetic cores that have coils wound on them and also have external control, detecting and processing circuits connected to the coils. The opening through the closed loop is sometimes conveniently referred to as its window. Prior art fluxgate current sensing devices have typically had windows no larger than a few inches. However, if a fluxgate current sensing device has a window with a circumference on the order of several feet (for example with a circumference approximating 9 feet) an external field, such as the earth's magnetic field, can introduce significant measurement errors. Those errors prevent accurate current measurement if the current sought to be measured is less than the error introduced by the external magnetic field.

The purpose of this invention is to compensate for, null out or cancel the effects of the external magnetic field so that accurate measurements of the current through the window can be made. Although the invention is directed to canceling the effects of the earth's magnetic field, it is also applicable to canceling out the effects of other ambient or external magnetic fields.

Prior Art Fluxgate Current Sensing

Fluxgate current sensing apparatus has been known in the prior art for decades. The fluxgate was invented in the early $20^{th}$ century and developed in the Second World War. Ring core fluxgate magnetometers models appeared in the 1930s but were further developed since 1962. This invention is an improvement in fluxgate current sensing apparatus. Some basic principles of their operation will be described before describing the invention because a device employing the invention also uses those basic principles in addition to its added innovations.

FIG. 1 illustrates the operational principles of a basic fluxgate current sensing apparatus but is simplified for purposes of explanation. It has a pair of closed loop cores 10 and 12 of magnetic material. Suitable materials are ferromagnetic materials in its broader sense of including materials with ferrimagnetic properties. The two cores 10 and 12 are ordinarily constructed to be physically and magnetically identical so they are matched cores. Although the cores 10 and 12 are illustrated as physically separate in order to facilitate a description of their electrical and magnetic operation, in an actual implementation they are physically positioned coaxially and side by side against each other after being assembled with various coil windings, tape and adhesive to secure them together. Preferably each of the cores is fabricated from a ribbon of ferromagnetic material that is wound into several turns like a roll of tape.

The purpose of the fluxgate current sensing apparatus of FIG. 1 is to measure the electrical current $I_{MEASURE}$ flowing through the opening, referred to as the window, through the closed loop cores 10 and 12. Two drive coils (not illustrated) are separately wound one around each of the cores and form helical coils with the closed loop core running along their circular central axes and preferably are wound all 360° around the entire loop. The two drive coils are series connected together so that a current $I_{DRIVE}$ through the drive coils creates circumferentially oppositely directed magnetic flux in the two cores, that is, one clockwise and the other counterclockwise. With two identical cores, that opposite magnetic flux results in a magnetic flux density B in each core that is identical in magnitude and opposite in direction from the flux density in the other core. However, in order to simplify the illustration, the drive current $I_{DRIVE}$ through the drive coils is illustrated in FIG. 1 as an axially directed current $I_{DRIVE}$ through the window of each core, but flowing in opposite axial directions through the two cores. This simplification is based upon the principle that a coil wound around a closed loop core creates a magnetic field in the core in the same direction as a single conductor through the core would create. The only difference is a scaling factor resulting from the number of turns of the coil. Those skilled in the art will recognize that application of the "right hand rule" to the illustrated $I_{DRIVE}$ would create the equal magnitude but circumferentially oppositely directed flux densities B in the cores 10 and 12.

The fluxgate current sensing apparatus of FIG. 1 also has a pair of current sensing coils 14 and 16 for sensing a signal that is processed to detect the current being measured, $I_{MEASURE}$. Preferably each current sensing coil 14 and 16 is wound 360° all the way around a different one of the two cores 10 and 12. As will be subsequently described, the voltages induced on the sensing coils 14 and 16 by the flux changes dΦ/dt in the cores is algebraically, electrically summed by series connecting the two sensing coils 14 and 16. However, equivalently as known to those skilled in the art, one current sensing coil can be wound around the side-by-side coaxially contiguous cores to provide an algebraically but magnetically summed induced voltage across the coil as a function of the net flux change dΦ/dt in the cores.

In the operation of the fluxgate current sensing apparatus of FIG. 1, the drive current $I_{DRIVE}$ has an amplitude that drives the cores 10 and 12 into saturation as illustrated by the solid black line on the B-H curve in FIG. 2, oscillogram 2A. The directions of saturation of the two cores are simultaneously opposite in the circumferential direction, one clockwise while the other is counterclockwise, and those directions alternate periodically in time. To accomplish this, the drive coils can be driven with an $I_{DRIVE}$ that has a typical waveform of a sinusoid or square wave, for example, so long as the amplitude of the drive current $I_{DRIVE}$ is sufficient to saturate the magnetic cores. Preferably, the drive coils are driven by a sine wave to reduce measurement inaccuracy from harmonic noise and potential electromagnetic interference, though square wave generation is often used for cost savings or convenience. The drive waveform frequency must meet the Nyquist criterion to measure the desired bandwidth of the window current signal. Most conventional fluxgates operate around 10 kHz, though operation in the range of a few Hz to several kHz is possible and depends on design constraints (required measurement bandwidth, slew rate of $I_{DRIVE}$ generator, maximum amplitude of $I_{DRIVE}$ generator, available power, etc.).

If there is no window current $I_{MEASURE}$, then the voltages induced in the current sensing coils 14 and 16 are of opposite polarity and in phase as illustrated in FIG. 2, oscillograms 2B and 2C. Consequently, they will sum to zero as illustrated in FIG. 2D. If there is an electrical current $I_{MEASURE}$ flowing through the window of the closed loop cores 10 and 12, that current produces a magnetic flux in both cores in the same circumferential direction. Consequently, in one core the magnitude of the magnetic flux resulting from the drive current $I_{DRIVE}$ adds to the magnitude of the magnetic flux resulting from the window current $I_{MEASURE}$. Simultaneously in the other core, the magnitude of the magnetic flux resulting from the drive current $I_{DRIVE}$ is subtracted from the magnitude of the magnetic flux resulting from the window current $I_{MEASURE}$. Because the drive current $I_{DRIVE}$ is periodically alternating, when the drive current changes polarity then the core in which the fluxes were adding become subtracting and the core in which the fluxes were subtracting become additive. At all times, the core in which the fluxes are additive reaches saturation earlier in time because the flux density B in that core is the arithmetic sum of two flux components. That advance of saturation is illustrated in oscillogram 2E by the movement to the left of the voltage pulse induced on one current sensing coil and in oscillogram 2A by the movement to the left of the B-H curve, shown as a dashed line. The core in which the fluxes are subtractive reaches saturation later because the flux density in the latter core is the resultant of the arithmetic difference of the two flux components. That delay of saturation is illustrated in oscillogram 2F by movement to the right of the voltage pulse induced on the other current sensing coil and in oscillogram 2A by the movement to the right of the B-H curve, shown as a dashed line.

The effect of the drive current $I_{DRIVE}$ is to apply a magnetic field bias in the circumferential direction to each of the two cores but in opposite circumferential directions in those cores. When the magnetic field bias is in the same circumferential direction as the magnetic field resulting from the measured current $I_{MEASURE}$, those fields are additive and consequently saturation occurs earlier in time; i.e. is advanced. When the magnetic field bias is in the opposite direction as the magnetic field resulting from the measured current $I_{MEASURE}$, those fields are subtractive and consequently saturation occurs later in time; i.e. is retarded.

The magnitude of the time advance and the time retarding of saturation and the resulting time shift of the pulses in oscillograms 2E and 2F is proportional to the flux around $I_{MEASURE}$ and therefore to $I_{MEASURE}$ itself. As illustrated in oscillogram 2G, the summation of the voltages on the two current sensing coils 14 and 16 gives a voltage that has its fundamental Fourier component at the second harmonic of $I_{DRIVE}$ and the duration of its pulses is proportional to the current $I_{MEASURE}$. Therefore, detection of the amplitude of that second harmonic component gives a signal that is proportional to the measured current $I_{MEASURE}$. The second harmonic amplitude, the fluxgate output, is generally measured using a lock-in amplifier.

As known to those skilled in the prior art, there are other structures and accompanying techniques that may be used with fluxgate current sensors to provide advantages and therefore also may be used with fluxgate current sensors that are improved by the present invention. One example is the use of the flux nulling or feedback technique to detect the window current. This technique improves the robustness of the system with respect to parameter changes and gains higher resolution and principally increased linearity. With this technique, an additional "nulling" coil is wound around the pair of cores and is connected to the output of a negative feedback control circuit. The feedback signal of that control circuit is the sensed window current $I_{MEASURE}$ that is detected as described above. The control input is zero so that the control circuit drives its output nulling coil with a current that drives the detected current to zero. With the detected window current driven to zero, the ampere-turns of the nulling coil is equal to the ampere turns from the window current. This technique offsets core flux from the current being measured, $I_{MEASURE}$, with a core flux from the nulling coil current so that, when they are equal, the error signal goes to zero. Consequently $I_{MEASURE}$ is easily calculated from the null coil current, the proportionality constant between them being the number of turns of the nulling coil.

Problems with Prior Art Fluxgate Current Sensors

Fluxgate current sensors of the type described above have proven to be one of the most accurate types of current sensing apparatus that is available. To the best of our knowledge, they have only been constructed with closed loop cores having dimensions on the order of a few inches or less. However, we have found that significant errors and inaccuracies are encountered if the size of the closed loop core is substantially scaled upward and the magnitude of the current sought to be measured is substantially scaled downward. One example of an application of the present invention is to measure the electrical current passing through seawater flowing into or out of the ballast tanks of a ship through the ship's sea grates.

Such an electrical current flow exists because the seawater contains electrically charged ions. In order to measure such an electrical current, the closed loop core assembly with its attached coils must have a circumference on the order of nine feet so that it entirely encircles the sea grate without obstructing water flow. Additionally, the core loop assembly must conform to the hull surface around the sea grate. Such a hull surface usually is not only non-planar, but also may have a complex curvature. We have found that, if a fluxgate current sensing apparatus is scaled upward to this size requirement and is applied in this environment to the measurement of electrical current through a sea grate, the amount of error present in the apparatus is greater than the current to be measured. Other examples of applications of the present invention include the measurement of electric current within a fluid contained in a pipeline, the measurement of electric current in water around an oil platform or bridge and generally the measurement of electric current in water or soil around a metal as a result of natural electrolysis or cathodic protection.

Therefore, it is an object and feature of the present invention to determine the source of the error and to provide a way to reduce that error sufficiently to permit acceptably accurate measurement of the electrical current through the window of the fluxgate current sensor so that it exhibits the required sensitivity and error tolerance.

BRIEF SUMMARY OF THE INVENTION

The invention compensates for circumferentially oriented components of an external magnetic field within segments of a closed loop core of ferromagnetic material by canceling those components. For each of a plurality of associated pairs of diagonally opposite segments around the closed loop core, the circumferentially oriented components of the external magnetic field at the associated pair of diagonally opposite segments are sensed and algebraically summed. A circumferentially oriented compensating magnetic field is applied to each segment of the associated pair, the applied field having a magnitude that drives the sensed external field to a minimum that is as close to zero as possible to, and preferably is, zero.

In order to accomplish the compensation, the invention has a plurality of external flux nulling circuits for nulling the external magnetic flux at each of a plurality of associated pairs of diagonally opposite segments of two side-by-side, coaxial closed loop cores. Each flux nulling circuit includes a pair of segment sensing coils wound around its associated diagonally opposite segments. The segment sensing coils are serially connected to each other at one end and have their opposite ends as feedback output terminals. Each flux nulling circuit also includes a pair of segment cancellation coils wound around associated diagonally opposite segments and serially connected to each other at one end and having their opposite ends as input terminals. A flux detecting circuit is connected to the feedback output terminals of the segment sensing coils of its associated segments and has an output representing the net magnetic flux in its associated segments. A negative feedback control circuit has its feedback input terminals connected to the outputs of the flux detecting circuits and has output terminals connected to the input terminals of associated, diagonally opposite flux cancellation coils. The negative feedback control circuit drives the segment cancellation coils with a current to drive the flux detected by the segment detecting circuit to a minimum value. The invention is particularly advantageous for compensating for the external earth's magnetic field that is incident upon a fluxgate current sensor.

BRIEF DESCRIPTION OF THE SEVERAL VIEWS OF THE DRAWINGS

FIG. 5 is a top plan view of the preferred embodiment of the invention.

FIG. 6 is a diagrammatic sectional view illustrating coil windings on a preferred embodiment of the invention.

FIG. 7 is a diagram illustrating a pair of cores with coils separately wound around each core and used to describe its equivalence to a single coil around both cores.

FIG. 8 is a diagram illustrating a pair of cores and a pair of diagonally opposite sensing coils of the invention.

Figure 1:
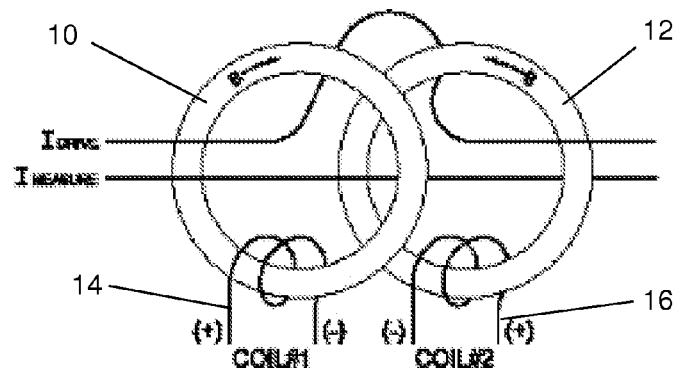
FIG. 1 is a diagram illustrating the operation of a prior art fluxgate current sensor.

In describing the preferred embodiment of the invention which is illustrated in the drawings, specific terminology will be resorted to for the sake of clarity. However, it is not intended that the invention be limited to the specific term so selected and it is to be understood that each specific term includes all technical equivalents which operate in a similar manner to accomplish a similar purpose. For example, the word connected or terms similar thereto are often used. They are not limited to direct connection, but include connection through other circuit elements where such connection is recognized as being equivalent by those skilled in the art. In addition, circuits are illustrated which are of a type which perform well known operations on electronic signals. Those skilled in the art will recognize that there are many, and in the future may be additional, alternative circuits which are recognized as equivalent because they provide the same operations on the signals.

DETAILED DESCRIPTION OF THE INVENTION

Theoretical Basis of Problem to be Solved by the Invention

The error that is described above arises from the interaction of the external magnetic field, which in the case of a ship's sea grate is predominantly the earth's magnetic field, with local anomalies in the magnetic properties that exist at locations around the closed loop. In a perfectly uniform external magnetic field, inequality in the construction of the fluxgate itself is a major source of these external magnetic field errors. These local anomalies include variations in the turn spacing of coils wound around a core and variations in the magnetic properties of ferromagnetic core material. Local anomalies in the magnetic properties of the closed loop core cause local variations in the magnetic flux density B and therefore vary the magnetic field intensity H at which the segments of the closed loop become magnetically saturated. Those local variations in magnetic properties result in local variations in the time at which saturation occurs and, therefore, their cumulative effect around the loop alters the ultimate current measurement. We have found that the magnetic field in the closed loop cores that results from the earth's magnetic field is 400,000 times greater than the field in the closed loop cores from the window current sought to be measured.

The local anomalies in the magnetic properties of the closed-loop core material can be caused by a variety of local variations in each core's properties. We believe that the principal cause of local variations is local departures in the shape, contour and alignment of the core away from a regular, symmetrical geometric shape such as a circle or square. Other possible local variations are local variations in the cross sectional area or the permeability μ of the closed loop which would also cause variations in the magnetic field intensity H at which local segments become magnetically saturated. Finally, although the magnetic flux of an external magnetic field, especially the earth's magnetic field, that is incident on a device is usually considered to be uniform at all locations on the device, nearby ferromagnetic materials, such as a ship's hull, could cause local variations in the external magnetic flux that is incident upon different locations along the closed loop cores.

The reason that these local variations are believed to be the source of the errors is that if the external magnetic field is uniform over the entire closed-loop cores and the cores are perfectly symmetrical, perfectly matched and have uniform magnetic properties circumferentially around the entire loop, then the effect of the external circumferential magnetic field component on one segment of the loop entirely cancels the effect of the external circumferential magnetic field component on the equally long, diagonally opposite segment of the loop. In other words, if the cores are perfectly matched, with identical and symmetrical shapes and identical sizes, and have perfectly uniform magnetic properties all around both closed loop cores, the external magnetic field component in the circumferential direction will have no net effect upon the sensed current $I_{MEASURE}$ or other electrical parameters because they are in opposite circumferential directions. Unfortunately, despite the quality and sophistication of manufacturing and fabrication technologies, imperfections are an inherent characteristic of any product.

Figure 3:
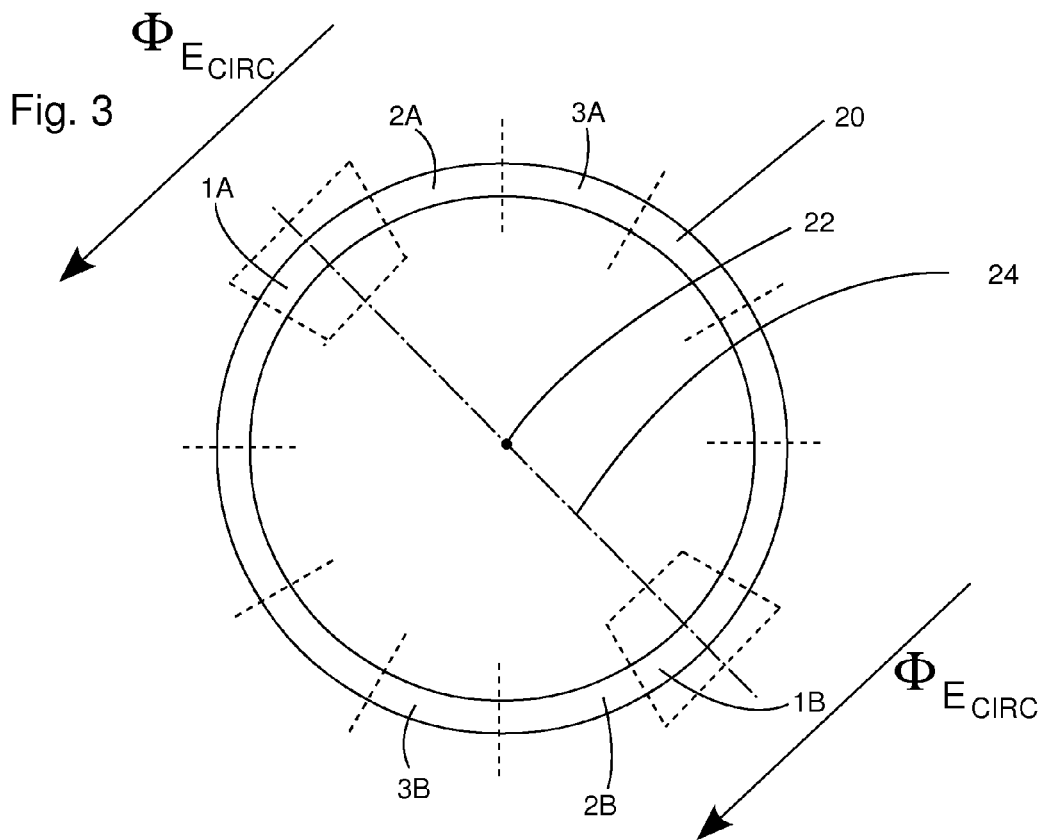
FIG. 3 is a top plan view of a closed loop core of ferromagnetic material and illustrating the principles of operation of the invention.
Figure 4:
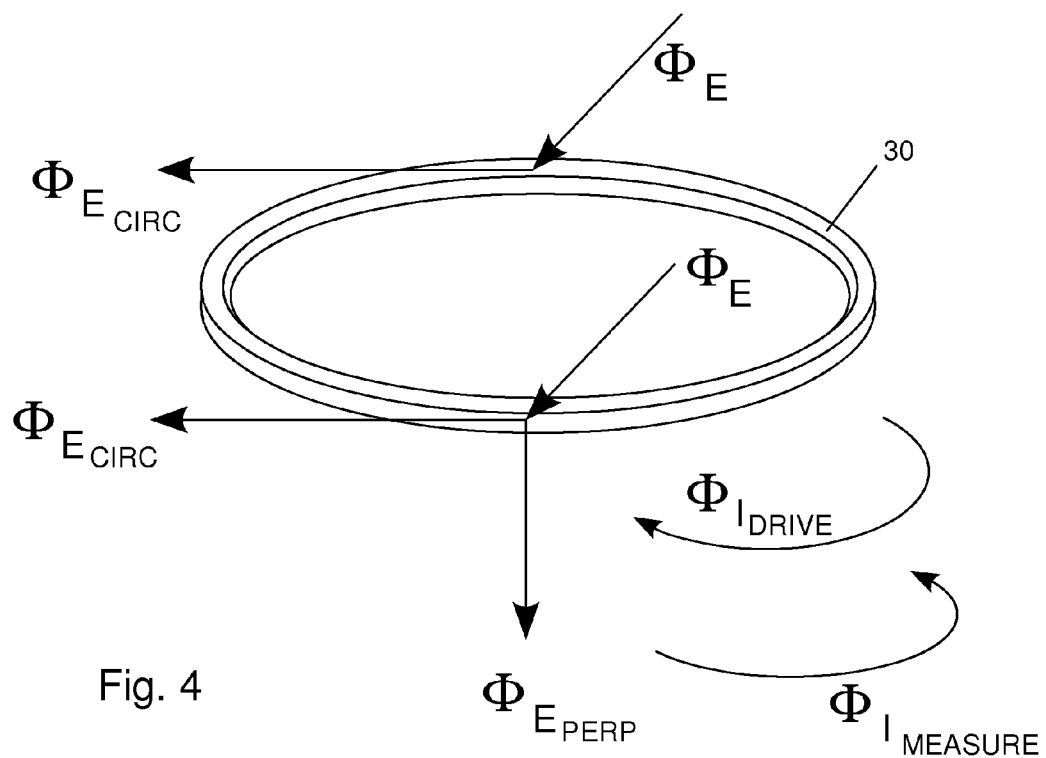
FIG. 4 is a view in perspective of a toroidal closed loop core showing flux vectors.

FIGS. 3 and 4 introduce some fundamental principles of the invention and terminology used to describe it. Referring to FIG. 3, a toroidal assembly 20 of closed loop cores and associated windings can be viewed as divided into a series of contiguous segments arranged end-to-end along the loop with their end boundaries equi-angularly spaced around the center 22 and illustrated as radial dashed lines. FIG. 3, like the preferred embodiment of the invention, has 12 such segments. However, the number of segments is not critical and can vary according to designer judgment about engineering tradeoffs. Importantly, the segments are considered as comprising diagonally opposite segment pairs. Diagonally opposite means that the segments are on opposite sides of the closed loop core and centered on a diagonal through the center of the loop. For example, segment 1A and its diagonally opposite segment 1B comprise one set of diagonally opposite segments that lie on diagonal 24. Similarly, segments 2A and 2B are a diagonally opposite pair of segments. Diagonally opposite segments are generally parallel segments that have parallel tangents and, for a toroidal assembly, the diagonal is a diametrical line such as line 24.

FIG. 4 illustrates the magnetic flux through a representative toroidal closed loop core 30. External magnetic flux incident upon the core can be resolved into a flux vector through a segment in the circumferential direction and a flux vector that is perpendicular to the segment. Only magnetic flux components in the circumferential direction have a major effect upon the operation of a fluxgate current sensor because only the time change of magnetic flux along the central axis of a coil induces a voltage in the coil. Magnetic flux that extends perpendicularly to a segment of the core has relatively little effect. In FIG. 4, the external magnetic field ΦE is incident upon the closed loop core assembly at some orientation, usually obliquely. However, the external magnetic field ΦE that is incident upon a segment of the core assembly will have a component $\Phi E_{CRC}$ in the circumferential direction and a component $\Phi E_{PERP}$ that is perpendicular to that segment. The component $\Phi E_{PERP}$ can be oblique to the plane of the toroidal core 30 and may be considered the resultant of a radial component and a component that is perpendicular to the plane of toroidal core 30. Each segment will also have a flux $\Phi I_{DRIVE}$ in the circumferential direction that is produced by the drive current $I_{DRIVE}$ and a flux $\Phi I_{MEASURE}$ in the circumferential direction that is produced by $I_{MEASURED}$. Although $\Phi I_{DRIVE}$ and $\Phi I_{MEASURE}$ are illustrated in FIG. 4 in opposite circumferential directions, as explained above they are at times in the same direction. However, at all times, the total flux $\Phi_{SUM}$ in the circumferential direction at each segment will be the algebraic sum of the circumferential flux components at the segment; that is:

$$\Phi_{SUM} = \Phi E_{CIRC} + \Phi I_{MEASURE} + \Phi I_{DRIVE}$$

The voltage induced on the portion of any coil wound around a core segment is proportional to the rate of change of the total flux $\Phi_{SUM}$ at that segment. The circumferentially oriented external field flux component $\Phi E_{CIRC}$ applies a magnetic field bias at each segment. That magnetic bias has the same effect at each segment as described above in connection with the drive current; namely, the magnetic bias advances or retards the time of saturation depending upon whether it is in the same or in the opposite circumferential direction as the magnet flux caused by the measured current $I_{MEASURE}$. However, the magnetic bias of $\Phi E_{CIRC}$ is in opposite circumferential directions in the diagonally opposite segments. Therefore, if the cores are perfectly matched, with identical and symmetrical shapes and identical sizes, and have perfectly uniform magnetic properties all around both closed loop cores, and if the component of the external magnetic field at both diagonally opposite segments are equal in magnitude, the biasing effect of the external magnetic field will be cancelled by the two diagonally opposite segments and will have no net effect upon the detected value of the sensed current $I_{MEASURE}$. However, if the circumferentially oriented external field flux components $\Phi E_{CIRC}$ at the diagonally opposite segments are equal, but there are local anomalies in the magnetic properties along the core, the magnetic flux density B at the two segments can be different so each segment will have an effective flux bias of different magnitude. This difference in flux density at the diagonally opposite segments will cause different time shifts in saturation and therefore the effects of the two segments will not cancel. Similarly, if the circumferentially oriented external field flux components $\Phi E_{CIRC}$ at the diagonally opposite segments are not equal, the biasing effect at the two segments will not cancel.

The solution of the present invention is to provide an apparatus that actively compensates for the local magnetic property and coil winding anomalies and loop mismatch at local segments distributed around the closed loops in order to null out or cancel the sources of error. There may be other sources of error that the present invention does not compensate for.

The magnetic field flux density B can be different at two diagonally opposite segments as a result of a non-uniform distribution of external magnetic field across the closed loop. Additionally, the perpendicular component (FIG. 4, $\Phi E_{PERP}$—perpendicular to a segment of the core) of the external magnetic field may also introduce an error. Although we believe that the present invention does not compensate for these errors, we also believe that any such errors are a relatively small percentage of the current measurements obtained by the present invention.

The Preferred Embodiment of the Invention

FIG. 5 illustrates the configuration of the preferred embodiment of the invention. Instead of a toroid, the preferred embodiment is a rectangle with rounded corners because that configuration closely follows the outline of the sea grate of a ship while avoiding sharp corners that would be likely to present uncertain and undesirable magnetic field complications and consequences. The dashed lines represent a closed loop assembly 50 of cores of magnetic material and associated coils that together form a part of a prior art fluxgate current sensing apparatus of the type previously described. The closed loop assembly 50 is viewed as subdivided into a series of 12 contiguous segments arranged end to end around the entire loop. The segments are not of equal length like those illustrated in FIG. 3, which are more appropriate for a toroid, but instead have longer segments along the linear sides and shorter segments along the curved corners. However, diagonally opposite segments have the same length; that is, they subtend the same angle. For the improvement of the invention, each segment has a pair of coils wound around the assembly 50, each pair represented by a rectangle in FIG. 5. Preferably, the two coils at each segment extend the length of their segment so that they are end-to-end contiguous with the two coils around their neighboring segments.

This arrangement of coils around the magnetic cores is illustrated in FIG. 6 in a diagrammatic cross-sectional view. FIG. 6 shows a representative partial interval of the assembly 50 with the end boundaries 51 and 52 of segments shown by vertical phantom lines. Each coil of the prior art assembly is shown by two dashed lines, one on each opposite side of the structure around which it is wound. There are two side-by-side cores 54 and 55. One drive coil 56 is wound around the core 54 and the second drive coil 57 is wound around the core 55 as described above. One current sensing coil 58 is also wound around the core 54 and the second current sensing coil 59 is wound around the core 55. A nulling coil 60, described above, is wound around the combined two side-by-side cores 54 and 55.

Examples of the pair of coils at each segment that are used with the invention are illustrated in FIG. 6 as solid lines. One example is described for the segment between its boundaries 51 and 52. However, each of the segments have a similar pair of coils, although in the preferred embodiment their lengths are different and correspond to the different lengths of the segments as illustrated in FIG. 5. One of the segment coils at each segment is a segment flux sensing coil 62. The other coil at each segment is a segment flux cancellation coil 64. Preferably, both the segment sensing coil at each segment and the segment cancellation coil at each segment are the same length and equal to the length of the segment. Preferably the segment sensing coils are wound outwardly of the segment cancellation coils, although those positions can be reversed.

Diagonally opposite segments and their diagonally opposite coils form associated pairs of coils. For example (FIG. 5), diagonally opposite segments 51A and 51B lie on diagonal 51D, diagonally opposite segments 52A and 52B lie on diagonal 52D and segments 53A and 53B lie on diagonal 53D. The diagonally opposite segment sensing coils are serially connected together at one end of each and the other two ends form a segment sensing coil feedback output. Similarly, the diagonally opposite segment cancellation coils are serially connected together at one end of each and the other two ends form input terminals for a flux compensation current.

It will become apparent to those skilled in the art that the number of segments into which the closed loop is divided is not critical. The use of more and shorter segments has the advantage of increased accuracy of compensation for the effect of the magnetic anomalies around the closed loop cores. The use of fewer and longer segments has the advantage of reduced cost and complexity. Consequently, the selection of the number of segments is a matter of tradeoffs based upon engineering judgment between these factors for particular applications of the invention. Similarly, it is not essential that the segment coils be end-to-end contiguous and it is not essential that the segment sensing coil and the segment cancellation coil at each segment have the same length. However, those parameters are believed preferable for maximum compensation and resulting current measurement accuracy.

Theory of Detecting the Effect of the External Magnetic Field

If two single coils are each separately wound around a different one of two side-by-side cores and their voltages are summed, that sum is the same as the voltage induced on a single coil wound around both cores, except for amplitude scaling for the number of coil turns. The diagonally opposite external field sensing coils of the invention are preferably single coils, each wound around both cores, although they could be separate coils. The equivalence of a single coil around both cores to two separate coils, each around a different core, is explained because reference is made to the voltages on hypothetical separate coils when explaining how the waveforms on the diagonally opposite single sensing coils are generated.

Figure 2:
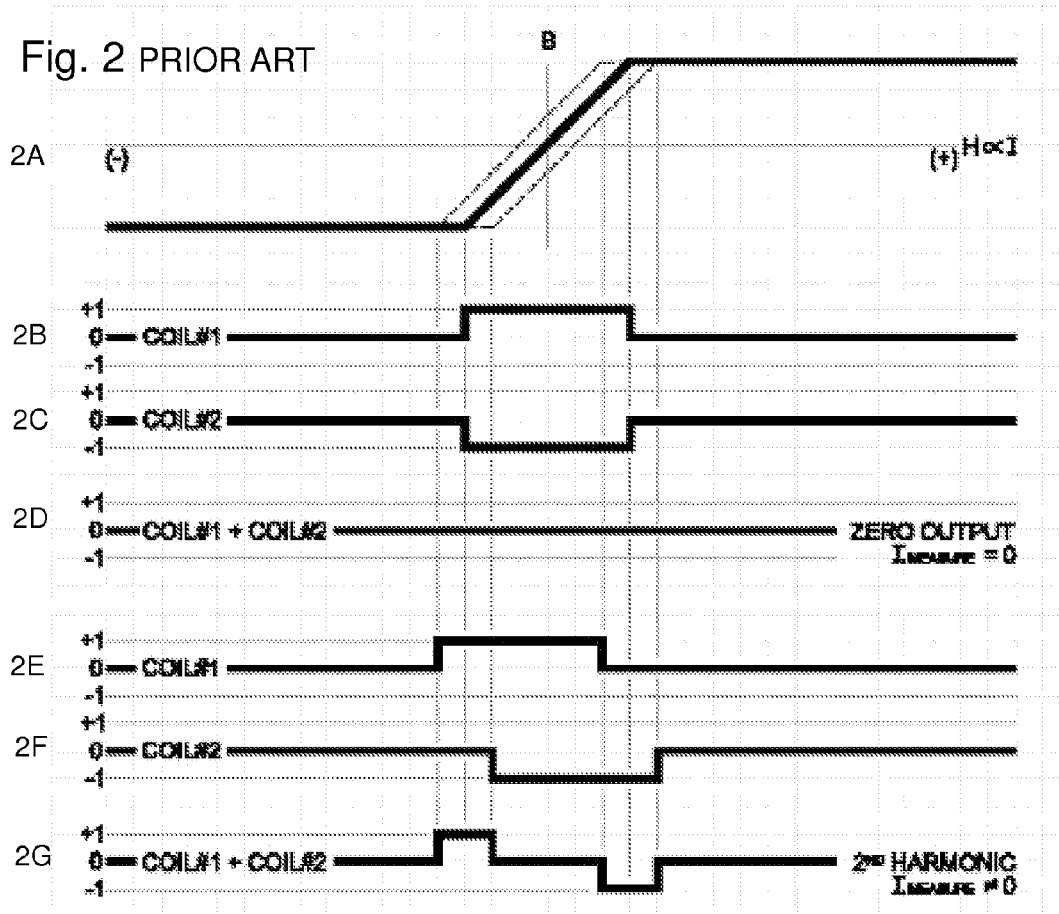
FIG. 2 is a series of oscillograms of signals in the fluxgate current sensor of FIG. 1.

As known to those skilled in the art and illustrated in FIG. 2A, a hysteresis loop for soft ferromagnetic materials can be approximated at its a transition region, where the core is unsaturated, by a straight line with a positive slope and at its saturation regions by horizontal lines joined to the opposite ends of the transition region. Additionally, sharp rectangular pulses are illustrated in the drawings for purposes of explanation. However, as also known to those skilled in the art, pulses have finite, usually exponential, leading and lagging edges and therefore, the actual waveforms can be expected to be considerably less sharp and more rounded than those illustrated in the drawings.

FIG. 7 diagrammatically illustrates two toroidal, side-by-side cores, with a separate coil A around one core and a separate coil B wound around the second core. In the following discussion these coils are referred to as hypothetical coils A and B because, when summed, they are equivalent to a sensing coil that is wound around both cores. Referring to FIG. 7, each half cycle of the fluxgate drive current produces magnetic flux $\Phi$ in opposite circumferential directions through two ferromagnetic core loops that are arranged side-by-side. The drive current $I_{DRIVE}$, shown in FIG. 9A, alternates periodically so the flux directions in both cores reverse each half cycle but are always in circumferentially opposite directions.

Figure 9:
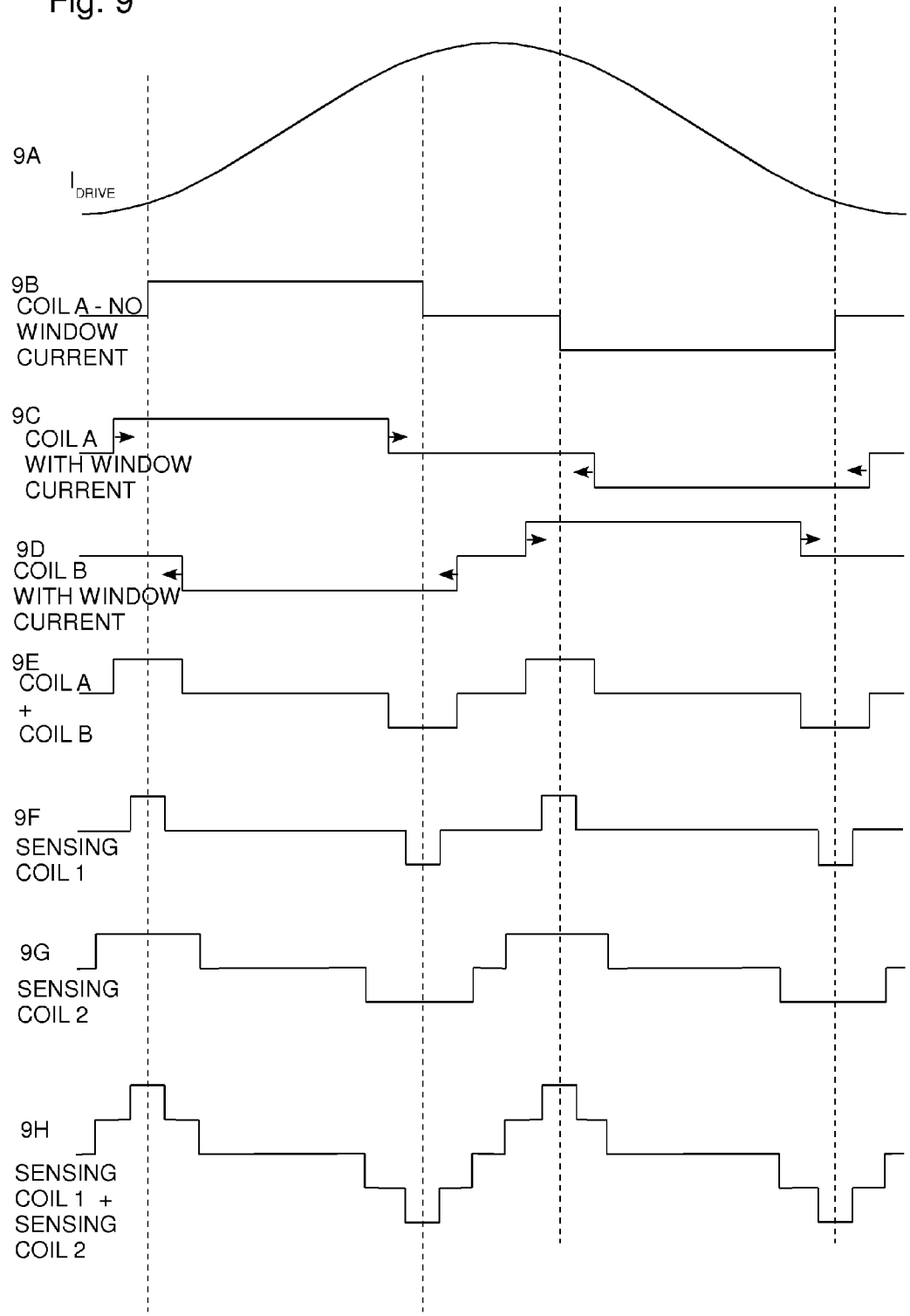
FIG. 9 is a series of oscillograms illustrating the operation of a preferred embodiment of the invention.

A coil that is wound around a single core senses the transition from saturation in one direction to saturation in the opposition direction in the core it is wound around. Each transition from saturation in one direction to saturation in the opposite direction produces a pulse because only during a transition is there an induced voltage because only then is there a dΦ/dt. During the transition, a pulse is induced that has a leading edge at the beginning of the transition and a lagging edge at the end of the transition. The pulse width is the time of the transition from saturation in one direction to saturation in the opposite direction. The pulse polarity represents the direction of that change. FIG. 9B shows the pulse induced on coil A when the only flux in the cores is from the drive current $I_{DRIVE}$. If coils A and B are identical, the pulse induced on coil B is identical except that it is inverted from the pulse induced on coil A because the flux Φ from the drive current $I_{DRIVE}$ is always in the opposite circumferential directions in the two cores. The pulse in FIG. 2, oscillogram 2B, is the same as the pulse in FIG. 9, oscillogram 9B, except that oscillogram 9B shows a full cycle.

The times at which the transitions begin and end (the leading and lagging edges of the pulses) are important parameters because any additional magnetic flux bias shifts the times of the leading and lagging edges to earlier (advances) or later (retards). When a magnetic flux bias is in the same direction in a core as the bias flux from the drive current, the core saturates sooner so the hysteresis curve and the pulse edges are advanced. When a magnetic flux bias is in the opposite direction in a core from the flux from the drive current, the core saturates later so the pulse edges are retarded. In effect, any additional magnetic flux bias advances or retards the transition region of the hysteresis curve depending upon whether the flux bias adds to or subtracts from the magnetic flux from the drive current.

A magnetic flux bias that is applied to both cores, such as by a window current or an external magnetic flux (e.g. the earth's magnetic field), shifts the beginning and the end of the transition regions of the two cores (advances or retards the leading and lagging edges of the pulses). If the magnetic flux bias and the magnetic flux from the drive current are in the same circumferential direction during a first half cycle of the drive current, then during the first half cycle of the drive current, the transition region is advanced in one core and retarded in the other core. During the second half cycle of the drive current, the directions of the time shifts (the advancing or retarding of the leading and lagging edges) in the cores are reversed. FIG. 9C shows the first pulse on coil A advanced during the first half cycle of the drive current as a result of the presence of a flux bias from a window current. This is also shown in FIG. 2E. As shown in FIG. 9C, the second pulse induced on coil A is retarded during the second half cycle of the drive current as a result of the presence of a flux bias from a window current. FIG. 9D shows the pulse train induced on coil B. The first pulse is retarded which is also shown in FIG. 2F. The second pulse during the second half cycle of the drive current is advanced. The directions of pulse advance or pulse retard in coil B are opposite from those on coil A because the drive current generates opposite magnetic flux in the two cores.

In the presence of a magnetic bias, if there are coils separately wound on each core and the voltages on the coils are instantaneously algebraically summed, the result is a pair of pulses during each half cycle of the drive current as shown in FIG. 9E. That is also shown in FIG. 2G. The leading edge of the first pulse is at the beginning of the transition from saturation in the first core and the lagging edge of that pulse is at the beginning of the transition from saturation in the second core. Therefore, the pulse width of the first pulse represents the sum of the time shifts of the transitions in the two cores, one being advanced and the other being retarded. The leading edge of the second pulse is at the end of the transition from unsaturated to saturated in the first core. The lagging edge of the second pulse is at the end of the transition from unsaturated to saturated for the second core. So the pulse width of the second pulse also represents the same sum of the time shifts.

Instead of summing a separate coil around each core (A+B), an equivalent result is obtained by a single coil wound around both cores. Instead of the flux change in each core inducing a voltage on a separate coil and then summing the coil voltages, with a single coil around both cores, the flux in the two cores is summed and the change in that total flux induces a voltage on the single coil. The summing is done magnetically. A single coil therefore produces the same two pulses (FIG. 9E) per half cycle (of the drive current) that result from connecting in series two coils that are each separately wound around the cores.

The window current can therefore be detected from the signal of FIG. 9E as explained previously and practiced in the prior art. The window current creates a proportional magnetic bias in the same circumferential direction both cores. The pulse width of the pulses on a single coil around both cores is proportional to the magnetic bias from the window current and therefore the pulse width is also proportional to the window current. Therefore, the amplitude of the fundamental component of those pulses is proportional to the window current and can be used to detect window current.

In order to explain the effect of a further magnetic bias from an external magnetic field upon the pulse train of FIG. 9E (which is also the pulse train induced on a single coil around both cores), FIG. 8 illustrates two diagonally opposite sensing coils that are a part of the invention. Sensing coil 1 is wound around both cores along a segment of the cores. Sensing coil 2 is also wound around both cores along a diagonally opposite segment of the cores. Because a pulse train induced on a sensing coil around both cores is identical to a pulse train that is the sum of the pulse trains induced on two separate coils, each around a different core, the additional advance and retard of the leading and lagging edges of the pulse train of FIG. 9E, can be analyzed by looking at the advance and retard of the pulses on the two hypothetical separate coils A and B (FIG. 7).

Preliminarily, it is important to recognize, as illustrated in FIG. 8, that the flux in the cores from the external flux $\Phi_{EXTERNAL}$ is in the opposite circumferential direction from the window current flux $\Phi_{WINDOW}$ at sensing coil 1 but is in the same circumferential direction from the window current flux at sensing coil 2. Therefore, the leading and lagging edges of the pulses induced on the hypothetical coils A and B (that represent coil 1) are additionally advanced and retarded in the directions shown by the small horizontal arrows in FIGS. 9C and 9D. In other words, the advance and retard of the leading and lagging edges are moved by the magnetic flux bias of the window current to the positions illustrated by the oscillograms in FIGS. 9C and 9D. But the leading and lagging edges are additionally advanced and retarded in the directions shown by the arrows by the magnetic flux bias of the external magnetic field.

With the leading and lagging edges being advanced and retarded in the direction of the arrows in FIGS. 9C and 9D, the algebraic sum of the pulse trains induced on hypothetical coils A and B gives a narrower pulse (FIG. 9F) than the pulses in FIG. 9E. So the pulse train in FIG. 9F is the pulse train on sensing coil 1 and is narrowed because the flux $\Phi_{WINDOW}$ is opposite in direction to the flux $\Phi_{EXTERNAL}$. However, at coil 2 the flux $\Phi_{WINDOW}$ is in the same direction as the flux $\Phi_{EXTERNAL}$. Therefore, at the diagonally opposite core segment, the flux bias from $\Phi_{EXTERNAL}$ advances and retards the leading and lagging edges of the pulse trains on hypothetical coils A and B in directions that are opposite to the arrow directions in FIGS. 9C and 9D. As can be seen from FIG. 9, these opposite directions of advance and retard cause the pulses at coil 2 to be made wider than the pulses of 9E, as illustrated in FIG. 9G. So the pulse trains of FIGS. 9F and 9G represent the pulse trains on coils 1 and 2.

In accordance with the invention, the pulses on sensing coil 1 and the pulses on sensing coil 2 are algebraically summed by connecting coil 1 and coil 2 in series. The algebraic sum is the pulse train illustrated in FIG. 9H which has a fundamental Fourier component at the second harmonic of the drive current $I_{DRIVE}$. The Fourier component at the fundamental frequency of the pulse train of FIG. 9H is proportional to the sum of $\Phi_{EXTERNAL}$ at coil 1 and $\Phi_{EXTERNAL}$ at coil 2. This series connection of the diagonally opposite sensing coils arithmetically adds the signal information for $\Phi_{EXTERNAL}$ at the two segments. But the series connection also arithmetically subtracts and cancels the window current information for $\Phi_{WINDOW}$.

Referring to FIG. 8, this can also be expressed mathematically. The external magnetic flux $\Phi_{EXTERNAL}$ at sensing coil 1 is in the opposite direction to the window current magnetic flux $\Phi_{WINDOW}$. Therefore, the voltage induced on sensing coil 1 equals the algebraic sum of the voltage induced on coil 1 due to the presence of the external field $\Phi_{EXTERNAL}$ and the voltage induced on coil 1 due to the presence of the window current $\Phi_{WINDOW}$. That gives $$V\text{coil 1} = V\text{coil 1}_{\Phi ext} - V\text{coil 1}_{\Phi window}$$

The external magnetic flux $\Phi_{EXTERNAL}$ at sensing coil 2 is in the same direction as the window current magnetic flux $\Phi_{WINDOW}$. Therefore, the voltage induced on sensing coil 2 equals the algebraic sum of the voltage induced on coil 2 due to the presence of the external field $\Phi_{EXTERNAL}$ and the voltage induced on coil 2 due to the presence of the window current $\Phi_{WINDOW}$. That gives $$V\text{coil 2} = V\text{coil 2}_{\Phi ext} + V\text{coil 2}_{\Phi window}$$

Connecting sensing coil 1 and sensing coil 2 in series gives the algebraic voltage sum $$V\text{coil 1} + V\text{coil 2} = V\text{coil 2}_{\Phi ext} + V\text{coil 1}_{\Phi ext}$$

Observation of oscillogram 9H reveals that its frequency is the second harmonic of the fundamental frequency of the drive current $I_{DRIVE}$ and the waveforms of FIGS. 9B through 9D. Consequently, the output 9H of the series connected diagonally opposite segment sensing coils can be used to detect that second harmonic and therefore obtain a signal representing the external magnetic flux in the two diagonally opposite segment sensing coils. For example, a well known fast Fourier transform (FFT) algorithm may be used in a digital processing unit to detect the second harmonic in 9H in the manner well known in the prior art. Preferably, however, a lock-in amplifier algorithm is used because it requires less computation since the intended frequency is known. It produces far more accuracy than an equivalently computationally intensive FFT would.

The above description of two diagonally opposite segments is applicable to all of the diagonally opposite, associated pairs of segments. Each associated pair of diagonally opposite segments has a diagonally opposite pair of segment sensing coils that are connected as an input to an external flux nulling control circuit. Each associated pair of diagonally opposite segments also has a diagonally opposite pair of segment cancellation coils that are connected to an output from the external flux nulling control circuit. That output applies a DC current through the two, diagonally opposite, series connected, segment cancellation coils for nulling the external static magnetic flux at its associated pair of diagonally opposite segments. In that manner the effect of the external magnetic field is compensated for at all of the segments around the loop.

Those skilled in the art will appreciate that the terms "static" and "DC" as used in the present context are relative terms. The earth's magnetic field is described as "static". However, it does change at a rate that is relatively slow compared to the rate of change of other magnetic fields that exist in embodiments of the invention. Additionally, the component of the earth's magnetic field in the circumferential direction of the core will vary, for example as a ship moves, as a function of the orientation of the core loop with respect to the earth's magnetic poles. Similarly, the "DC" current through the segment cancellation coils will vary as that circumferential component of the earth's magnetic field changes. That current changes as a function of time so that the "static" magnetic field from the segment cancellation coils will continue to null out the varying earth's "static" magnetic field. Therefore, the words "static" and "DC" mean only that the relatively slow changes associated with them are so much slower than other changes with respect to time, that the operation of the apparatus of the invention or the prior art fluxgate current sensor is unaffected by the slow changes.

Control Algorithm

As described above, the output 9H of the series connected diagonally opposite segment sensing coils has a fundamental frequency component (at the second harmonic of the drive current $I_{DRIVE}$) with an amplitude that is proportional to the sum of the external magnetic field components in the two diagonally opposite segments. Therefore, a signal representing the sum of the external magnetic field components along the diagonally opposite segments can be detected by using a Fourier transform or other algorithm known in the prior art to detect the amplitude of that fundamental.

The amplitude of that fundamental, which represents the sum of the external magnetic field in the two, diagonally opposite segments, is then applied to a negative feedback control system that has the two, diagonally opposite, segment compensation coil connected in series at its output. A negative feedback control system conventionally has a control input that determines the desired output of the system and a negative feedback loop that represents the sensed current output. The difference between the control input and the negative feedback signal represents the error which drives the output toward a zero error in the manner well known in the art. However, with the invention there is no control input, that is the control input is effectively zero. The diagonally opposite, segment compensation coils for each segment are wound and connected together and to the output of the negative feedback control so that the magnetic field that results from the current through the segment compensation coils is opposite in direction to the external magnetic fields in the segments that are sensed by the segment sensing coils in the diagonally opposite segments. Consequently, the negative feedback control drives the segment cancellation coils with a current that generates a magnetic field that is equal and opposite to the sensed external magnetic field. In other words, the negative feedback control drives its effective error signal (the amplitude of the fundamental), which represents the sum of the external magnetic field in the two, diagonally opposite segments, toward, and as close as possible to, zero. As a result, the magnetic field generated by the segment compensating coils cancels the external magnetic field in the diagonally opposite segments. That is done for each diagonally opposite pair of segments. Of course, the feedback control for each diagonally opposite pair of segments is dynamic so as the external magnetic field changes, the compensation changes and continues to the cancellation. Because the external magnetic field at each pair of diagonally opposite pair of segments is cancelled, the errors that arise from the effect of the external field on magnetic anamolies are greatly reduced or eliminated. In the event that the external magnetic fields at the diagonally opposite segments are slightly different, the sum of the two diagonally opposite sensing coils represents twice the average external field in the two opposite segments. In that case, one segment is slightly overcompensated and the opposite segment is equally undercompensated. It is believed, however, that the overcompensation of one segment is counterbalanced by the undercompensation of the opposite segment.

Simplified Control System

The active flux compensation of the present invention nulls out the earth's magnetic field component in the circumferential direction for each associated pair of diagonally opposite segments of a closed loop core. The circuit for accomplishing that is independent of the current detecting circuit of a fluxgate current sensing apparatus. In embodiments of the invention, all functions, including control, analysis and detection processes, are performed digitally in a programmed digital processor. However, these functions and processes can be described in terms of analogous analog circuits that perform the same functions and processes.

Figure 10:
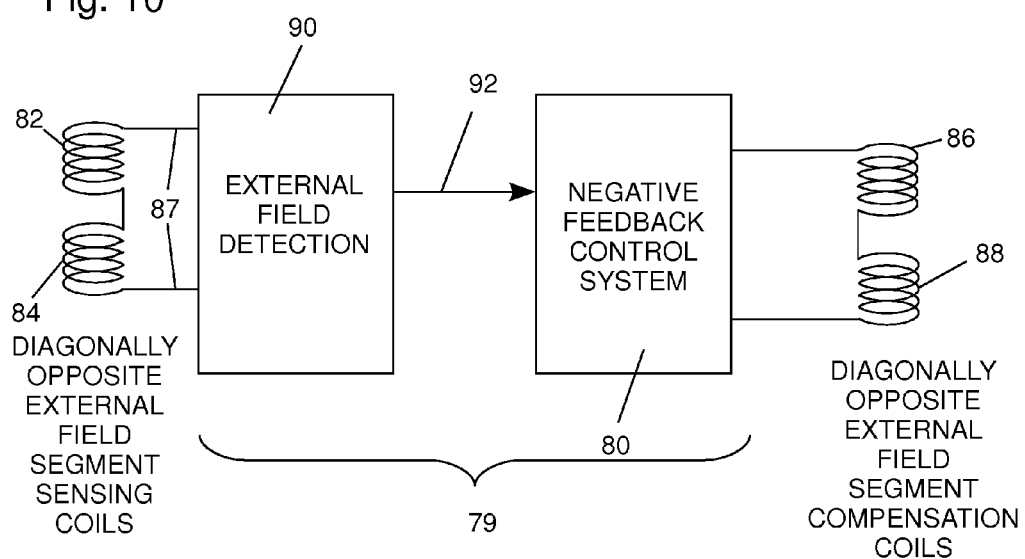
FIG. 10 is a block circuit diagram illustrating a simplified control system for an embodiment of the invention.

FIG. 10 shows a control that is simplified for the purpose of explanation and applies to a single pair of diagonally opposite segments. Each pair of diagonally opposite segments has an external flux nulling control 79 like that illustrated in FIG. 10. For example, for the embodiment of the invention that is illustrated in FIG. 3, there are 6 controls like that illustrated in FIG. 10. Consequently, a description of one serves as a description of all 6 controls.

The external field flux nulling control circuit 79 includes a negative feedback control 80 that has an input 92 feedback signal derived from the two segment sensing coils 82 and 84, which are series connected as described above. The sum of the voltages induced on the segment sensing coils 82 and 84 is the pulse train of FIG. 9H and is applied to an external field detector 90. The external field detector 90 is the device or software implemented algorithm that obtains the amplitude of the fundamental of the pulse train of FIG. 9H. That fundamental represents the sum of the external magnetic field at the diagonally opposite segments.

The output of the negative feedback control 80 is applied to the two series connected diagonally opposite segment cancellation coils 86 and 88. As described above, the negative feedback control circuit 80 drives the two segment cancellation coils 86 and 88 to insert a compensating magnetic flux at the two diagonally opposite segments that is equal and opposite to the circumferential component of the external magnetic field at those segments.

In the absence of a compensating current through the diagonally opposite segment cancellation coils 86 and 88, the input 87 from the two segment sensing coils 82 and 84 would be the algebraic sum of their induced voltages with the waveform shown in FIG. 9H. The external field at the two diagonally opposite segments would be detected by a detector 90, using an algorithm described above for detecting the amplitude of the fundamental of the pulse train of FIG. 9H. That detector 90 (implemented in software) provides an output 92 that represents the earth's magnetic field at the diagonally opposite segments. The output 92 functions as the feedback signal for the negative feedback control 80. There is no control input and no summation of a control input with the feedback signal to give an error signal. Instead, the feedback signal itself functions as the error signal. Consequently, the negative feedback control loop causes the control 80 to apply a current to the series connected segment cancellation coils 86 and 88 that drives the flux of the external magnetic field in the diagonally opposite segments toward and as near as possible to zero. In other words, in accordance with the well know feedback control principles, the control tries to drive the error to zero and the error is the external magnetic flux detected from the FIG. 9H pulse train. This means that the series connected, diagonally opposite segment cancellation coils are wound and electrically connected to apply the current to each from the control circuit 80 in a direction that is opposite to the circumferential component of the external magnetic field at both of the diagonally opposite segments. Those compensating magnetic fields are in the same linear direction, one applying a compensating magnetic field in the clockwise direction and the other applying a compensating magnetic field in the counterclockwise direction. That reduces the sum of the external magnetic field and the field from the segment cancellation coils to zero, or as near to zero as possible. The compensating magnetic fields thereby reduce or eliminate errors from the imperfections in the fluxgate that cause error in the presence of an external magnetic field. The well known proportional-integral-derivative controller (PID controller) is the most commonly used feedback controller and illustrates the control principles in the simplified embodiment of the present invention that is illustrated in FIG. 8. However, because the present invention is a nonlinear, multiple-input/multiple-output system, it is not the preferred control system.

The Preferred Control System

Figure 11:
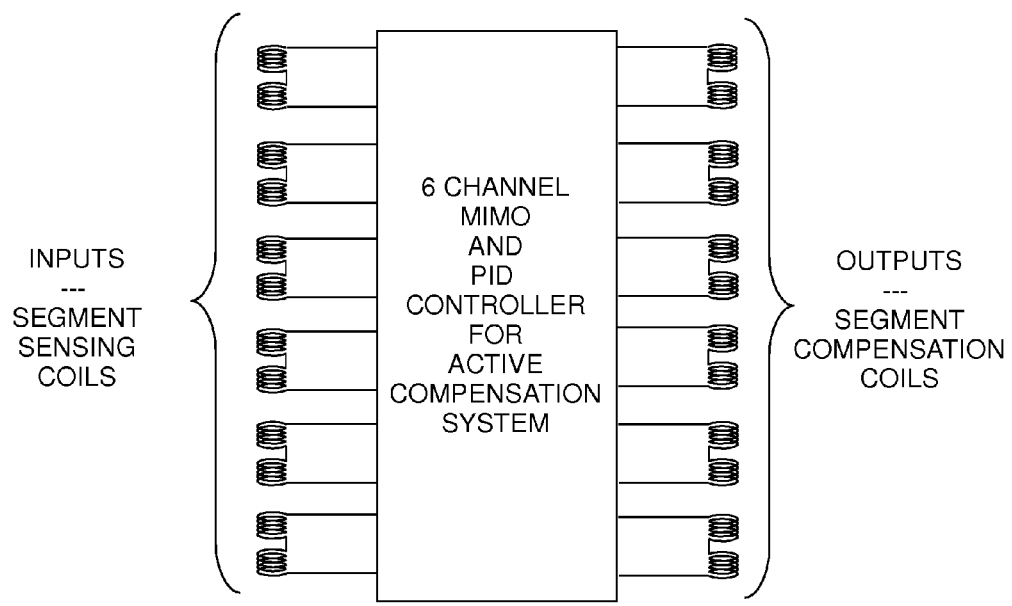
FIG. 11 is a block circuit diagram illustrating the control system of the preferred embodiment of the invention.

A complicating characteristic of the neighboring segments around the loop is that there is magnetic interaction between neighboring segments. The interaction is principally because the magnetization of a section of core also magnetizes neighboring sections. Secondarily, the segment sensing and segment cancellation coils at each segment may interact with their neighboring segment sensing and segment cancellation coils. Although the interaction declines as a function of the distance to a neighbor, the existence of interactions makes it desirable to apply the design principles of a more sophisticated control system in order to account for the interactions in a manner that provides a stable, non-oscillating system. Applicable control systems are known in the prior art for controlling a nonlinear, multiple-input/multiple-output (MIMO) system such as the present invention. The preferred embodiment illustrated in FIG. 5 is a 6 channel, nonlinear, MIMO system because it has 6 pairs of diagonally opposite segments each pair having two diagonally opposite input segment sensing coils and two diagonally opposite output segment cancellation coils. FIG. 11 illustrates the connection of the coils to the MIMO controller.

Although such controllers and the procedures for designing them are well known in the control art, an appendix is filed with this patent application that is specifically directed to the design of a controller for the invention. Because other quantities of diagonally opposite segments and their coils can be used, the described control system can be adapted for a different quantity of inputs and outputs by applying principles known in the art. The terminology used in the appendix varies somewhat from the above terminology. For example, the function of the invention is referred to as active shielding instead of active compensation. The reason is that compensation for the effects of the external magnetic field is like virtual shielding of the core and its coils from the external magnetic field. Additionally, the segment sensing coils are referred to as sense coils and the segment cancellation coils are referred to as compensation coils.

The principles of the present invention are applicable to canceling or nulling the external magnetic field in other types of devices that use closed loop ferromagnetic cores, such as ac current sensors and current transformers.

This detailed description in connection with the drawings is intended principally as a description of the presently preferred embodiments of the invention, and is not intended to represent the only form in which the present invention may be constructed or utilized. The description sets forth the designs, functions, means, and methods of implementing the invention in connection with the illustrated embodiments. It is to be understood, however, that the same or equivalent functions and features may be accomplished by different embodiments that are also intended to be encompassed within the spirit and scope of the invention and that various modifications may be adopted without departing from the invention or scope of the following claims.

The invention claimed is:

1. An apparatus for canceling circumferentially oriented components of an external magnetic field within segments of a pair of coaxial, closed loop cores of magnetic material, the cores having surrounding drive coils connected to an electrical drive circuit that, when operating, drives the cores into simultaneous circumferentially opposite saturation in a periodically alternating sequence, the apparatus comprising:
   (a) a plurality of external flux nulling circuits, each flux nulling circuit for nulling the external magnetic flux at an associated pair of diagonally opposite segments of the closed loop cores, each flux nulling circuit comprising
      (i) a pair of segment sensing coils, each sensing coil wound around a different one of its associated diagonally opposite segments, the segment sensing coils being serially connected to each other at one end and having their opposite ends as feedback output terminals;
      (ii) a pair of segment cancellation coils, each cancellation coil wound around a different one of its associated diagonally opposite segments and serially connected to each other at one end and having their opposite ends as input terminals;
      (iii) a flux detecting circuit connected to the feedback output terminals of the segment sensing coils of its associated segments and having an output representing the magnetic flux in its associated segments; and
      (iv) a negative feedback control circuit having input terminals connected to the output of the flux detecting circuits and having output terminals connected to the input terminals of associated, diagonally opposite segment cancellation coils, the negative feedback control circuit driving the segment cancellation coils with a current that drives the flux detected by the flux detecting circuit to a minimum value.

2. An apparatus in accordance with claim 1 wherein the cores have surrounding coils and a controller that form a fluxgate current sensor.

3. An apparatus in accordance with claim 2 wherein each segment sensing coil and its associated segment flux cancellation coil are the same length at diagonally opposite segments.

4. An apparatus in accordance with claim 3 wherein the segment sensing coil and the segment cancellation coil at each segment are end-to-end contiguous with the segment sensing coils and the segment cancellation coils at adjacent segments.

5. An apparatus in accordance with claim 2 wherein the cores have opposite linear side portions joined by rounded corner portions and wherein the segment sensing coils and the segment cancellation coils at segments of the linear portions have a longer circumferential length than segment sensing coils and segment cancellation coils at segments of the rounded portions.

6. An apparatus in accordance with claim 5 wherein the circumferential length of the cores is greater than 4 feet.

7. An apparatus in accordance with claim 6 wherein the circumferential length of the cores is substantially 9 feet.

8. An apparatus in accordance with claim 7 wherein there are 6 associated pairs of diagonally opposite segments.

9. An apparatus in accordance with claim 8 wherein the segment sensing coil and its associated segment cancellation coil are the same length at diagonally opposite segments.

10. An apparatus in accordance with claim 9 wherein the segment sensing coil and the segment cancellation coil at each segment are end-to-end contiguous with the segment sensing coils and the segment cancellation coils at adjacent segments.

11. A method for canceling circumferentially oriented components of an external magnetic field within segments of a closed loop core of magnetic material, the core having a surrounding drive coil connected to an electrical drive circuit that, when operating, drives the core into circumferentially opposite saturation in a periodically alternating sequence, the method comprising:
   for each of a plurality of associated pairs of diagonally opposite segments around the closed loop core
      (a) sensing the circumferentially oriented components of external magnetic fields at the associated pair of diagonally opposite segments and algebraically summing the sensed components;
      (b) applying a circumferentially oriented compensating magnetic field to each segment of the associated pair in a direction opposite to the sensed components, the applied field having a magnitude that drives the sensed magnetic field to a minimum that substantially cancels the external magnetic field.

12. A method in accordance with claim 11 wherein the sensed magnetic fields for each associated pair of diagonally opposite segments is driven to a minimum by applying the sensed magnetic fields for all the diagonally opposite segments to a multiple-input/multiple-output negative feedback control that controls the circumferentially oriented static magnetic field that is applied to each segment of the associated pairs.

13. A method in accordance with claim 12 wherein there are two coaxial, side-by-side, closed loop cores of ferromagnetic material with coils forming a fluxgate current sensor and wherein the method further comprises sensing the electrical current through the closed loop cores.

* * * * *